United States Patent
Huang et al.

(10) Patent No.: US 9,166,487 B2
(45) Date of Patent: Oct. 20, 2015

(54) PACKAGE STRUCTURE INTEGRATING A START-UP COMPONENT, A CONTROLLER, AND A POWER SWITCH

(71) Applicant: Zentel Electronics Corp., Hsinchu (TW)

(72) Inventors: Jun Hsiung Huang, Hsinchu (TW); Yu Wen Chang, Hsinchu (TW)

(73) Assignee: ZENTEL ELECTRONICS CORP., Hsinchu (TW)

( * ) Notice: Subject to any disclaimer, the term of this patent is extended or adjusted under 35 U.S.C. 154(b) by 74 days.

(21) Appl. No.: 14/099,669

(22) Filed: Dec. 6, 2013

(65) Prior Publication Data

US 2015/0162844 A1   Jun. 11, 2015

(51) Int. Cl.
| | |
|---|---|
| H01L 29/00 | (2006.01) |
| H01L 23/495 | (2006.01) |
| H02M 3/335 | (2006.01) |
| H01L 25/16 | (2006.01) |
| H01L 25/11 | (2006.01) |
| H01L 23/00 | (2006.01) |
| H02M 1/36 | (2007.01) |
| H02M 1/00 | (2007.01) |

(52) U.S. Cl.
CPC ........... *H02M 3/33569* (2013.01); *H01L 24/05* (2013.01); *H01L 24/49* (2013.01); *H01L 25/115* (2013.01); *H01L 25/16* (2013.01); *H02M 1/36* (2013.01); *H02M 3/33523* (2013.01); *H01L 2224/04042* (2013.01); *H01L 2224/05147* (2013.01); *H01L 2224/48091* (2013.01); *H01L 2224/48101* (2013.01); *H01L 2224/48137* (2013.01); *H01L 2224/48647* (2013.01); *H01L 2224/48747* (2013.01); *H01L 2224/48847* (2013.01); *H01L 2224/49171* (2013.01); *H01L 2924/13091* (2013.01); *H01L 2924/14* (2013.01); *H02M 2001/0006* (2013.01)

(58) Field of Classification Search
CPC ....... H01L 25/16; H01L 25/115; H01L 24/05; H01L 2224/04042; H01L 2224/48137
USPC ................................... 257/502, 676
See application file for complete search history.

(56) References Cited

U.S. PATENT DOCUMENTS

| | | | | |
|---|---|---|---|---|
| 6,593,622 | B2 * | 7/2003 | Kinzer et al. | 257/341 |
| 7,295,453 | B2 * | 11/2007 | Shiraishi et al. | 363/144 |
| 7,687,885 | B2 * | 3/2010 | Hashimoto et al. | 257/532 |
| 7,898,092 | B2 * | 3/2011 | Lu et al. | 257/777 |
| 2005/0156204 | A1 * | 7/2005 | Uno et al. | 257/213 |

* cited by examiner

*Primary Examiner* — Luan C Thai
(74) *Attorney, Agent, or Firm* — Ming Chow; Sinorica, LLC

(57) ABSTRACT

A package structure integrating a start-up component, a controller, and a power switch for a power converter, wherein the power converter has a coil having a first end and a second end, and the first end is coupled to a rectifier, the package structure including: a first die pad for carrying a chip of the controller; a second die pad for carrying a chip of the start-up component and a chip of the power switch, wherein the chip of the start-up component has a bottom surface providing a first drain contact; and the chip of the power switch has a bottom surface providing a second drain contact; and a plurality of external connection leads, of which one is connected with the second die pad via a wire and is used to couple with the second end of the coil.

6 Claims, 4 Drawing Sheets

PACKAGE STRUCTURE INTEGRATING A START-UP COMPONENT, A CONTROLLER, AND A POWER SWITCH

BACKGROUND OF THE INVENTION

1. Field of the Invention

The present invention relates to a package structure of a controller module for power conversion applications, especially to a package structure of a controller module including a start-up component, a controller, and a power switch.

2. Description of the Related Art

Please refer to FIG. 1a, which illustrates a circuit diagram of a prior art power converter, and FIG. 1b, which illustrates the package structure of a controller module applicable in the prior art power converter of FIG. 1a. As illustrated in FIG. 1a, the prior art power converter includes a PWM (pulse width modulation) controller 100, a first NMOS (n type metal oxide semiconductor) transistor 110, a second NMOS transistor 120, a primary coil 130 for transferring power to a load, and an auxiliary coil 140 for generating a supply voltage $V_{CC}$; and in FIG. 1b, the controller module is in the form of an integrated circuit package having a package structure integrating a chip 100c of the PWM controller 100, a chip 110c of the first NMOS transistor 110, and a chip 120c of the second NMOS transistor 120 of FIG. 1a.

The PWM controller 100 has two contacts for connecting with the first NMOS transistor 110, one contact for connecting with the supply voltage $V_{CC}$, and one contact for providing a PWM signal $V_{PWM}$ to switch on/off the second NMOS transistor 120 for realizing a power conversion.

The first NMOS transistor 110, having a first drain coupled to a first end A of the primary coil 130, a first gate connected to one contact of the PWM controller 100, and a first source connected to another contact of the PWM controller 100, is used as a start-up component, which is switched on to provide a current path for starting up the PWM controller 100 during an initial period after an AC power $V_{AC}$ is applied, and is switched off by the PWM controller 100 when the supply voltage $V_{CC}$ is built up. That is, when the supply voltage $V_{CC}$ reaches a predetermined level, the PWM controller 100 will send a low voltage to the first gate of the first NMOS transistor 110 to switch off the first NMOS transistor 110.

The second NMOS transistor 120, acting as a power switch, has a second drain coupled to a second end B of the primary coil 130, a second gate coupled with the PWM signal $V_{PWM}$, and a second source connected with a current sensing resistor for generating a current sensing signal $V_{CS}$ according to a primary current $I_P$. The second NMOS transistor 120 controls an on period for the primary current $I_P$ to flow through the primary coil 130 in response to the PWM signal $V_{PWM}$.

The package structure in FIG. 1b includes the chip 100c of the PWM controller 100, the chip 110c of the first NMOS transistor 110, the chip 120c of the second NMOS transistor 120, a resin material 200, a first die pad 210, a second die pad 220, a third die pad 230, and eight external connection leads.

The resin material 200 is used to enclose the chip 100c of the PWM controller 100, the chip 110c of the first NMOS transistor 110, the chip 120c of the second NMOS transistor 120, the first die pad 210, the second die pad 220, and the third die pad 230.

The first die pad 210 is made of a conductor, copper for example, for carrying the chip 110c of the first NMOS transistor 110. The chip 110c of the first NMOS transistor 110 has a top surface providing a gate contact G1 and a source contact S1, and a bottom surface providing a drain contact D1 which is electrically connected with the first die pad 210.

The second die pad 220 is made of a conductor, copper for example, for carrying the chip 100c of the PWM controller 100.

The third die pad 230 is made of a conductor, copper for example, for carrying the chip 120c of the second NMOS transistor 120. The chip 120c of the second NMOS transistor 120 has a top surface providing a gate contact G2 and a source contact S2, and a bottom surface providing a drain contact D2 which is electrically connected with the third die pad 230.

The interconnections among the chip 100c, the chip 110c, the chip 120c, and the external connection leads are accomplished by wires, which can be made of copper, gold, or aluminum. As can be seen in FIG. 1b, a wire 251 connects the first die pad 210 with an external connection lead 241 of the eight external connection leads, and a wire 252 connects the third die pad 230 with an external connection lead 242 of the eight external connection leads, wherein the external connection lead 241 is used to connect electrically with the first end A of the primary coil 130, and the external connection lead 242 is used to connect electrically with the second end B of the primary coil 130.

As the die pads constitute a substantial portion of the cost of the package structure of the controller module, it is therefore desirable to reduce the number of die pads to promote the market competition ability of the controller module. However, as can be seen in FIG. 1a and FIG. 1b, the first die pad 210, the second die pad 220, and the third die pad 230 all seem to be necessary for implementing the controller module. For example, if we put the chip 110c and the chip 120c into one die pad to save one die pad, then the drain contact D1 will be in direct electrical contact with the drain contact D2, making the power module not applicable for the prior art power converter of FIG. 1a. Therefore, it is not easy to reduce the cost of the package structure of the controller module for power converters.

SUMMARY OF THE INVENTION

One objective of the present invention is to disclose a package structure of a controller module, which can reduce the number of die pads used in the package structure.

Another objective of the present invention is to disclose a package structure of a controller module, which can provide a freedom of two ways of ending a start-up period for a power converter.

Still another objective of the present invention is to disclose a package structure of a controller module, which can reduce the cost of the controller module.

To attain the foregoing objectives, the present invention proposes a package structure integrating a start-up component, a controller, and a power switch for a power converter, wherein the power converter has a coil for transferring power, the coil has a first end and a second end, and the first end is coupled to a rectifier, the package structure including:

a first die pad made of a conductor, used for carrying a chip of the controller;

a second die pad made of the conductor, used for carrying a chip of the start-up component and a chip of the power switch, wherein the chip of the start-up component has a top surface providing a first gate contact and a first source contact, and a bottom surface providing a first drain contact which is electrically connected with the second die pad; and the chip of the power switch has a top surface providing a second gate contact and a second source contact, and a bottom surface providing a second drain contact which is electrically connected with the second die pad;

a plurality of external connection leads, wherein one of the plurality of external connection leads is connected with the second die pad via a wire and is used to couple with the second end of the coil; and a resin material, used to enclose the chip of the controller, the chip of the start-up component, the chip of the power switch, the first die pad, and the second die pad.

In one embodiment, the controller is a PWM controller, the start-up component is a first NMOS transistor, and the power switch is a second NMOS transistor.

In one embodiment, the conductor is copper.

In one embodiment, the wire is made of a material selected from a group consisting of copper, gold, and aluminum.

To attain the foregoing objectives, the present invention proposes another package structure integrating a start-up component, a controller, and a power switch for a power converter, wherein the power converter has a coil for transferring power, the coil has a first end and a second end, and the first end is coupled to a rectifier, the package structure comprising:

a first die pad made of a conductor, used for carrying a chip of the start-up component and a chip of the power switch, wherein the chip of the start-up component has a top surface providing a first gate contact and a first source contact, and a bottom surface providing a first drain contact which is electrically connected with the first die pad; and the chip of the power switch has a top surface providing a second gate contact and a second source contact, the second source contact being used to carry the controller, and a bottom surface providing a second drain contact which is electrically connected with the first die pad;

a plurality of external connection leads, wherein one of the plurality of external connection leads is connected with the first die pad via a wire and is used to couple with the second end of the coil; and a resin material, used to enclose the chip of the controller, the chip of the start-up component, the chip of the power switch, and the first die pad.

In one embodiment, the controller is a PWM controller, the start-up component is a first NMOS transistor, and the power switch is a second NMOS transistor.

In one embodiment, the conductor is copper.

In one embodiment, the wire is made of a material selected from a group consisting of copper, gold, and aluminum.

To make it easier for our examiner to understand the objectives, structure, innovative features, and performance of the invention, we use preferred embodiments together with the accompanying drawings for the detailed description of the invention.

BRIEF DESCRIPTION OF THE DRAWINGS

FIG. 1b illustrates a package structure of a controller module applicable in the prior art power converter of FIG. 1a.

FIG. 2b illustrates a preferred embodiment of the package structure of a controller module applicable in the power converter of FIG. 2a.

FIG. 2c illustrates another preferred embodiment of the package structure of a controller module applicable in the power converter of FIG. 2a.

DETAILED DESCRIPTION OF THE PREFERRED EMBODIMENTS

The present invention will be described in more detail hereinafter with reference to the accompanying drawings that show the preferred embodiments of the invention.

To solve the problem mentioned above, the present invention rearranges the start-up circuit of the power converter to make the first drain of the first NMOS transistor and the second drain of the second NMOS transistor share a common contact, so as to reduce the die pad number of the package structure of the controller module.

Figure 1A:
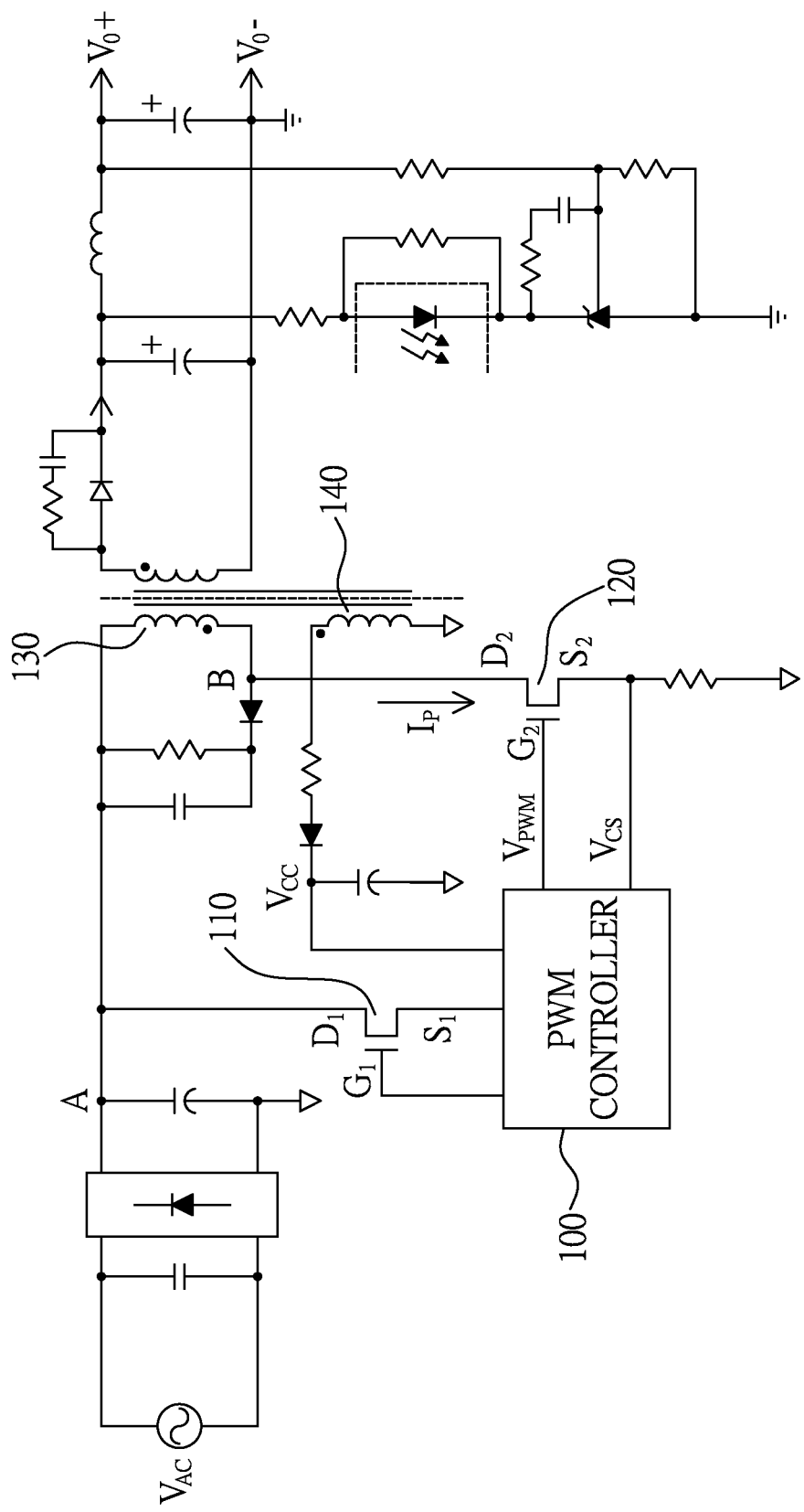
FIG. 1a illustrates a circuit diagram of a prior art power converter.
Figure 1B:
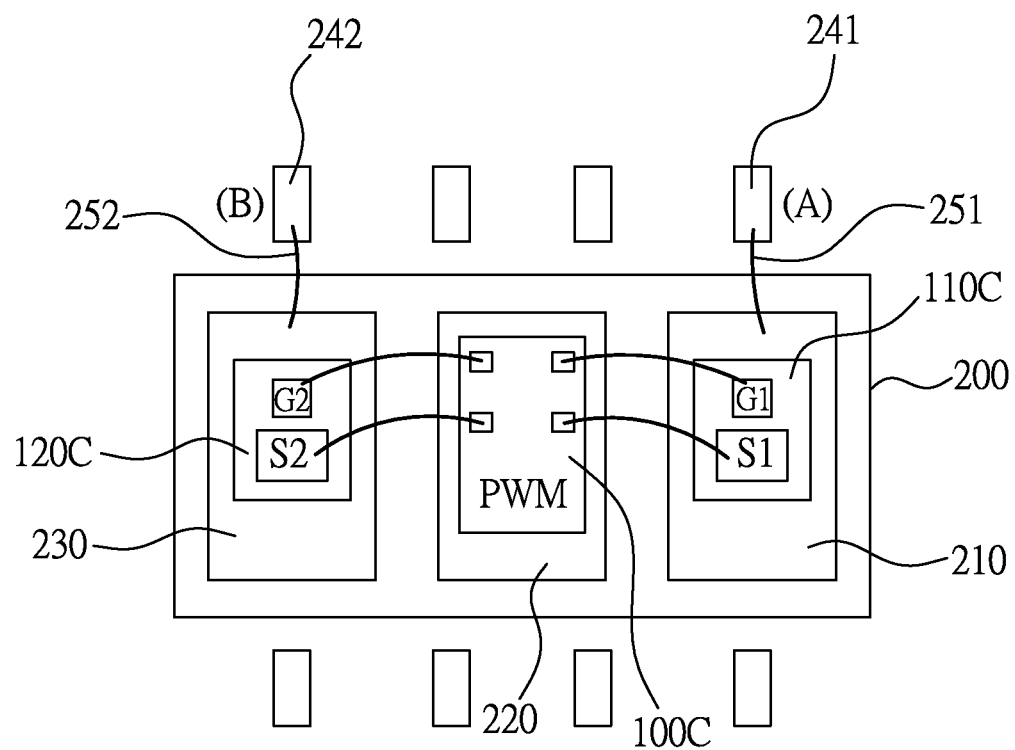
Figure 2A:
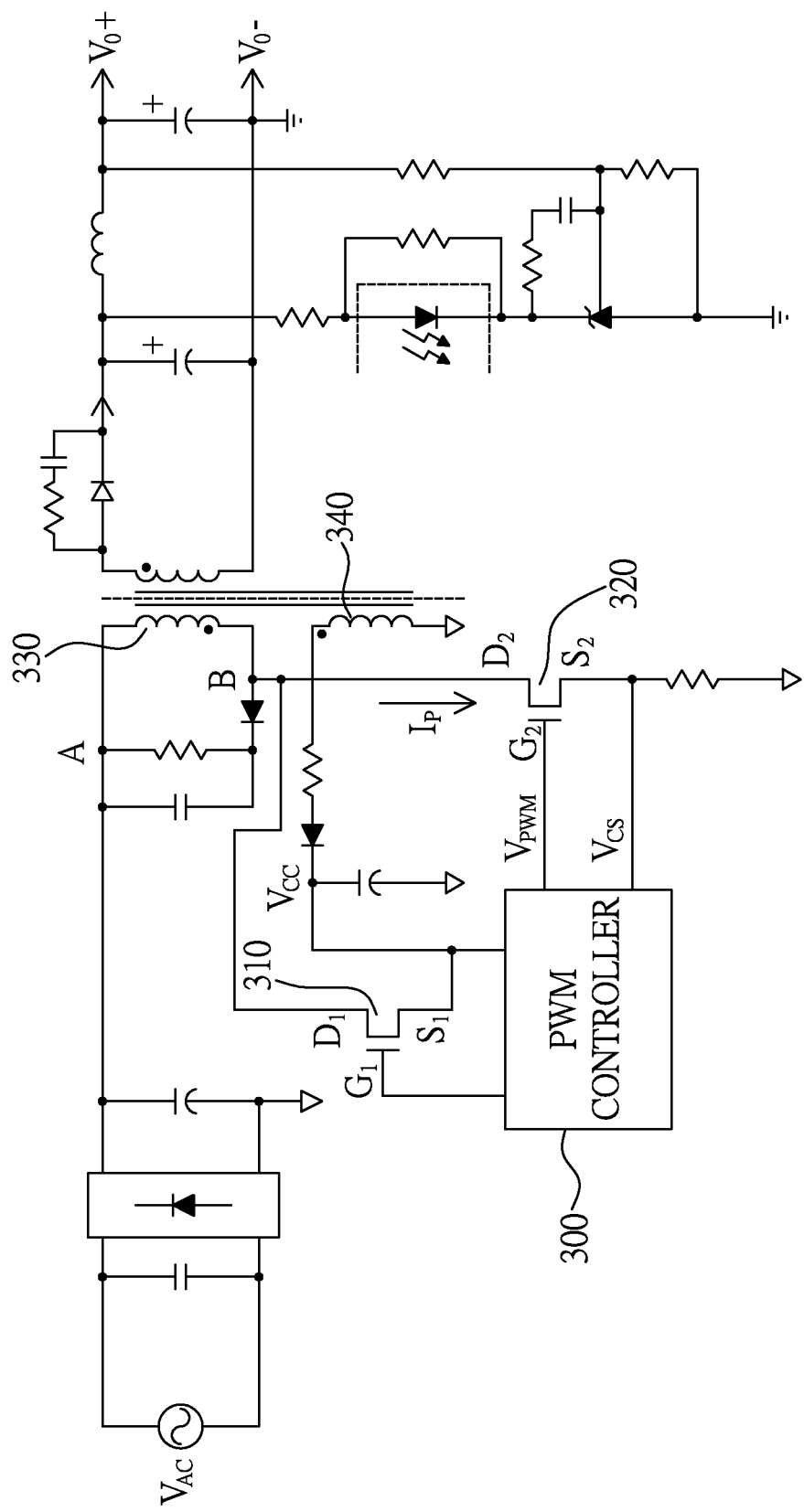
FIG. 2a illustrates a circuit diagram of a power converter using a controller module of the present invention.

Please refer to FIG. 2a, which illustrates a circuit diagram of a power converter using a controller module of the present invention. As illustrated in FIG. 2a, the power converter includes a PWM controller 300, a first NMOS transistor 310, a second NMOS transistor 320, a primary coil 330 having a first end A and a second end B, the first end A being coupled to a rectifier, and an auxiliary coil 340 for generating a supply voltage $V_{CC}$.

The PWM controller 300 has a first contact and a second contact for connecting with the first NMOS transistor 310, and a third contact for providing a PWM signal $V_{PWM}$ to switch on/off the second NMOS transistor 320 for realizing a power conversion.

The first NMOS transistor 310, having a first drain coupled to the second end B of the primary coil 330, a first gate coupled with the first contact of the PWM controller 300, and a first source coupled with the second contact of the PWM controller 300 and with the supply voltage $V_{CC}$, is used as a start-up component, which is switched on to provide a current path for starting up the PWM controller 300 during an initial period after an AC power $V_{AC}$ is applied, and is switched off when the supply voltage $V_{CC}$ is built up, wherein the first NMOS transistor 310 can be shut down sorely by the supply voltage $V_{CC}$ when the supply voltage $V_{CC}$ reaches a predetermined voltage value to cause the gate-source voltage of the first NMOS transistor 310 to be smaller than a threshold, or shut down by the PWM controller 300 which applies a low voltage to the first gate of the first NMOS transistor 310 when the supply voltage $V_{CC}$ reaches the predetermined voltage value.

The second NMOS transistor 320, acting as a power switch, has a second drain coupled to the second end B of the primary coil 330, a second gate coupled with the PWM signal $V_{PWM}$, and a second source connected with a current sensing resistor for generating a current sensing signal $V_{CS}$ according to a primary current $I_P$. The second NMOS transistor 320 controls an on period for the primary current $I_P$ to flow through the primary coil 330 in response to the PWM signal $V_{PWM}$.

Figure 2B:
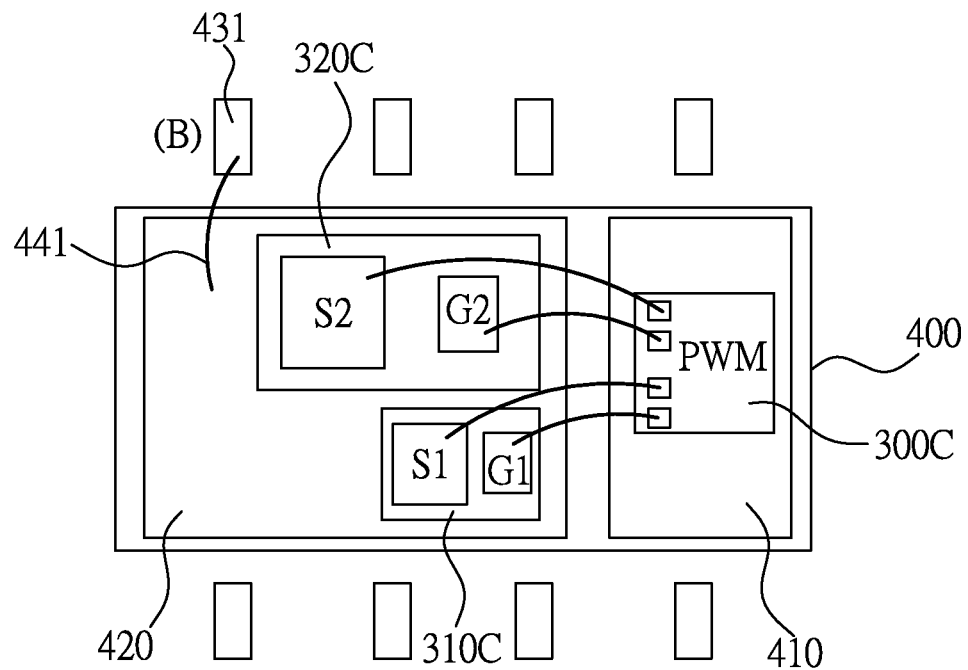

Please refer to FIG. 2b, which illustrates a preferred embodiment of the package structure of a controller module applicable in the power converter of FIG. 2a. The package structure in FIG. 2b includes a chip 300c of the PWM controller 300, a chip 310c of the first NMOS transistor 310, a chip 320c of the second NMOS transistor 320, a resin material 400, a first die pad 410, a second die pad 420, and eight external connection leads.

The resin material 400 is used to enclose the chip 300c of the PWM controller 300, the chip 310c of the first NMOS transistor 310, the chip 320c of the second NMOS transistor 320, the first die pad 410, and the second die pad 420.

The first die pad 410 is made of a conductor, copper for example, for carrying the chip 300c of the PWM controller 300.

The second die pad 420 is made of a conductor, copper for example, for carrying the chip 310c of the first NMOS transistor 310 and the chip 320c of the second NMOS transistor 320. The chip 310c of the first NMOS transistor 310 has a top surface providing a first gate contact G1 and a first source contact S1, and a bottom surface providing a first drain contact D1 which is electrically connected with the second die pad 420. The chip 320c of the second NMOS transistor 320 has a top surface providing a second gate contact G2 and a second source contact S2, and a bottom surface providing a second drain contact D2 which is electrically connected with the second die pad 420 and thereby electrically connected with the first drain contact D1.

The interconnections among the chip 300c, the chip 310c, the chip 320c, and the external connection leads are accomplished by wires, which can be made of copper, gold, or aluminum. As can be seen in FIG. 2b, a wire 441 connects the second die pad 420 with an external connection lead 431 of the eight external connection leads, the external connection lead 431 being used to connect electrically with the second end B of the primary coil 330. To keep the figure easy to read, wire connections for other external connection leads are omitted in the figure because they are not the focus of the present invention.

Thanks to a novel arrangement of the start-up circuit of the power converter in FIG. 2a, the first drain of the first NMOS transistor 310 and the second drain of the second NMOS transistor 320 can share a common contact (the second end B of the primary coil 330), and the chip 310c of the first NMOS transistor 310 and the chip 320c of the second NMOS transistor 320 can therefore be placed on a same die pad (the second die pad 420) of the package structure of the controller module in FIG. 2b to reduce the die pad number, and thereby cut down the cost of the package structure of the controller module.

Figure 2C:
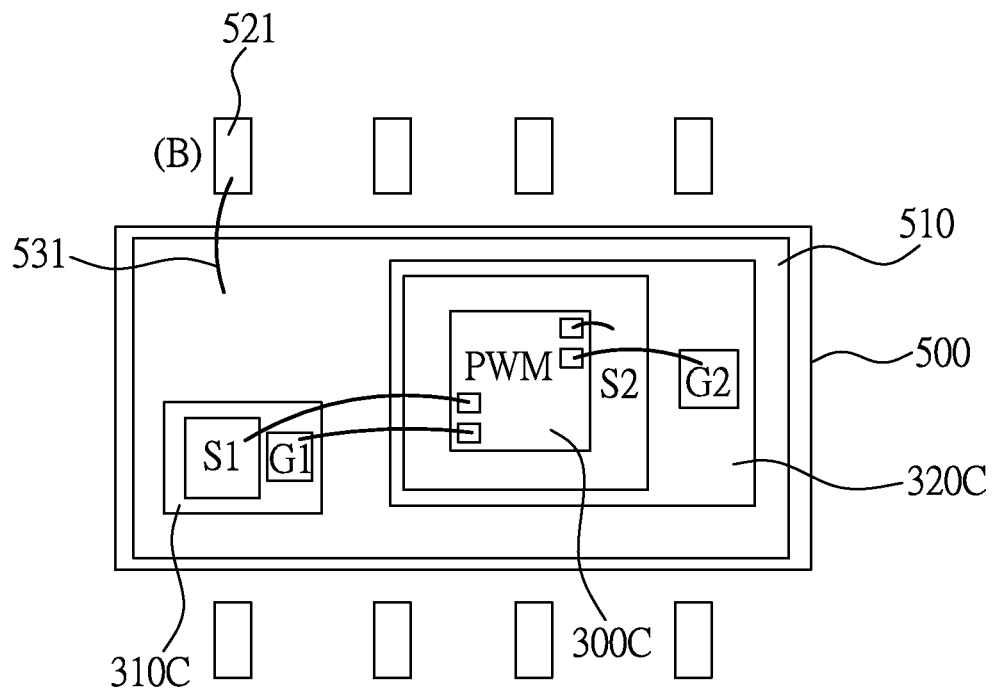

Please refer to FIG. 2c, which illustrates another preferred embodiment of the package structure of a controller module applicable in the power converter of FIG. 2a. The package structure in FIG. 2c includes a chip 300c of the PWM controller 300, a chip 310c of the first NMOS transistor 310, a chip 320c of the second NMOS transistor 320, a resin material 500, a first die pad 510, and eight external connection leads.

The resin material 500 is used to enclose the chip 300c of the PWM controller 300, the chip 310c of the first NMOS transistor 310, the chip 320c of the second NMOS transistor 320, and the first die pad 510.

The first die pad 510 is made of a conductor, copper for example, for carrying the chip 310c of the first NMOS transistor 310 and the chip 320c of the second NMOS transistor 320, and the chip 300c of the PWM controller 300 is placed on a second source contact area S2 of the chip 320c, wherein the chip 300c has an insulating bottom surface in contact with the second source contact area S2.

The chip 310c of the first NMOS transistor 310 has a top surface providing a first gate contact G1 and a first source contact S1, and a bottom surface providing a first drain contact D1 which is electrically connected with the first die pad 510. The chip 320c of the second NMOS transistor 320 has a top surface providing a second gate contact G2 and the second source contact S2, and a bottom surface providing a second drain contact D2 which is electrically connected with the first die pad 510 and thereby electrically connected with the first drain contact D1.

The interconnections among the chip 300c, the chip 310c, the chip 320c, and the external connection leads are accomplished by wires, which can be made of copper, gold, or aluminum. As can be seen in FIG. 2c, a wire 531 connects the first die pad 510 with an external connection lead 521 of the eight external connection leads, the external connection lead 521 being used to connect electrically with the second end B of the primary coil 330. To keep the figure easy to read, wire connections for other external connection leads are omitted in the figure because they are not the focus of the present invention.

Apart from the embodiments illustrated above, the chip 300c of the PWM controller 300 can also be directly placed on the first die pad 510, as long as the electrical insulation between the PWM controller 300 and the first die pad 510 is well ensured.

With the designs elaborated above, the present invention possesses the following advantages:

1. The package structure of the controller module of the present invention is capable of reducing the number of die pads.
2. The package structure of the controller module of the present invention is capable of providing a freedom of two ways of ending the start-up period of a power converter.
3. The package structure of the controller module of the present invention is capable of reducing the cost of the controller module.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance over the conventional structure and further complies with the patent application requirements and is submitted to the Patent and Trademark Office for review and granting of the commensurate patent rights.

What is claimed is:

1. A package structure integrating a start-up component, a controller, and a power switch for a power converter, wherein said power converter has a primary coil for transferring power and an auxiliary coil for generating a supply voltage, said primary coil has a first end and a second end, and said first end is coupled to a rectifier, said package structure comprising:

a first die pad made of a conductor, used for carrying a chip of said controller;

a second die pad made of said conductor, used for carrying a chip of said start-up component and a chip of said power switch, wherein said chip of said start-up component has a top surface providing a first gate contact and a first source contact, and a bottom surface providing a first drain contact which is electrically connected with said second die pad; and said chip of said power switch has a top surface providing a second gate contact and a second source contact, and a bottom surface providing a second drain contact which is electrically connected with said second die pad;

a plurality of external connection leads, wherein one of said plurality of external connection leads is connected with said second die pad via a wire and is used to couple with said second end of said primary coil;

a resin material, used to enclose said chip of said controller, said chip of said start-up component, said chip of said power switch, said first die pad, and said second die pad;

the controller being a PWM controller, the start-up component being a first NMOS transistor, and the power switch being a second NMOS transistor;

the PWM controller having a first contact and a second contact for connecting with the first NMOS transistor, and a third contact for providing a PWM signal to switch on/off the second NMOS transistor for realizing a power conversion;

the second NMOS transistor having a second drain coupled to the second end of the primary coil, a second gate coupled with the PWM signal, and a second source connected with a current sensing resistor for generating a current sensing signal according to a primary current;

the second NMOS transistor controlling an "on" period for the primary current to flow through the primary coil in response to the PWM signal;

the first drain of the first NMOS transistor and the second drain of the second NMOS transistor sharing the second end of the primary coil as a contact; and the chip of the first NMOS transistor and the chip of the second NMOS transistor being placed on the second die pad.

2. The package structure as disclosed in claim 1, wherein said conductor is copper.

3. The package structure as disclosed in claim 1, wherein said wire is made of a material selected from a group consisting of copper, gold, and aluminum.

4. A package structure integrating a start-up component, a controller, and a power switch for a power converter, wherein said power converter has a primary coil for transferring power and an auxiliary coil for generating a supply voltage, said primary coil has a first end and a second end, and said first end is coupled to a rectifier, said package structure comprising:

a first die pad made of a conductor, used for carrying a chip of said start-up component and a chip of said power switch, wherein said chip of said start-up component has a top surface providing a first gate contact and a first source contact, and a bottom surface providing a first drain contact which is electrically connected with said first die pad; and said chip of said power switch has a top surface providing a second gate contact and a second source contact, said second source contact being used to carry said controller, and a bottom surface providing a second drain contact which is electrically connected with said first die pad;

a plurality of external connection leads, wherein one of said plurality of external connection leads is connected with said first die pad via a wire and is used to couple with said second end of said primary coil;

a resin material, used to enclose said chip of said controller, said chip of said start-up component, said chip of said power switch, and said first die pad;

the controller being a PWM controller, the start-up component being a first NMOS transistor, and the power switch being a second NMOS transistor;

the PWM controller having a first contact and a second contact for connecting with the first NMOS transistor, and a third contact for providing a PWM signal to switch on/off the second NMOS transistor for realizing a power conversion;

the second NMOS transistor having a second drain coupled to the second end of the primary coil, a second gate coupled with the PWM signal, and a second source connected with a current sensing resistor for generating a current sensing signal according to a primary current;

the second NMOS transistor controlling an "on" period for the primary current to flow through the primary coil in response to the PWM signal;

the first drain of the first NMOS transistor and the second drain of the second NMOS transistor sharing the second end of the primary coil as a contact; and the chip of the first NMOS transistor and the chip of the second NMOS transistor being placed on the first die pad.

5. The package structure as disclosed in claim 4, wherein said conductor is copper.

6. The package structure as disclosed in claim 4, wherein said wire is made of a material selected from a group consisting of copper, gold, and aluminum.

\* \* \* \* \*